March 29, 1966 HIROSHI KODERA ETAL 3,243,324

METHOD OF FABRICATING SEMICONDUCTOR DEVICES BY ALLOYING
A GOLD DISK CONTAINING ACTIVE IMPURITIES
TO A GERMANIUM PELLET
Filed Sept. 5, 1963

3,243,324
Patented Mar. 29, 1966

3,243,324

METHOD OF FABRICATING SEMICONDUCTOR DEVICES BY ALLOYING A GOLD DISK CONTAINING ACTIVE IMPURITIES TO A GERMANIUM PELLET

Hiroshi Kodera, Ota-ku, Tokyo-to, Shinya Iida, Hachiojishi, and Yoshimitsu Sugita, Kodaira-shi, Japan, assignors to Kabushiki Kaisha Hitachi Seisakusho, Tokyo-to, Japan, a company of Japan Filed Sept. 5, 1963, Ser. No. 306,863
Claims priority, application Japan, Sept. 7, 1962, 37/38,119
9 Claims. (Cl. 148—177)

Figure 1:
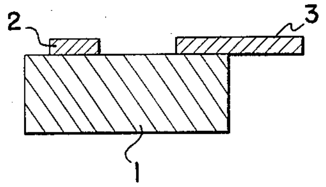

This invention relates to techniques used in the fabrication of semiconductor devices, and more particularly it relates to a new method of fabricating semiconductor devices having superior features including good reproducibility.

The alloying method has been widely used as a method of forming junctions in the manufacture of transistors for general use. In the production of alloyed junction type transistors with germanium as their base material, indium or lead have been mainly used as a principal constituent of alloying materials. In addition, eutectic compositions of germanium and one of the metals such as gold and lead have been tried as the principal constituents of alloying materials because of their low melting points and sufficiently good wetting. Furthermore, the process has been used whereby aluminum is evaporated and alloyed to form the emitter of mesatype transistors.

Grown junction type transistors are provided with base lead connections through the process of bonding gold wires by current pulse. In order to obtain good ohmic contact at the narrow base layers of widths of 10 microns or less, and good rectifying contacts at the collector and emitter regions, gold wires containing a group III or V impurity, such as gold-gallium alloy wires or gold-antimony alloy wires, have been used.

In the methods among those as mentioned above, wherein indium, lead, or the aforesaid eutectic alloys are used, these alloying materials melt at temperatures lower than those at which they react with the base material, germanium. For this reason, in each case the solution of the base material proceeds after the alloying material has melted and spread itself over the base material, thereby losing its original shape prior to heating. Therefore, the junction area produced subsequent to the alloying is not equivalent to the dimensions of alloying materials prior to heating.

Furthermore, although the junction area and the penetration depth are ordinarily controlled by the alloying temperature and the surrounding atmosphere during the alloying process and also by preparing the base material, germanium, by a certain predetermined treatment, undesirable overspreading of the alloying material often occurs. As a result, structural defects are readily created along the periphery of the pn junction, and the junction characteristics are impaired.

In the method wherein gold wire is used, the pointed end of the wire is to contact the germanium, and an electric current is passed from the gold wire to the germanium, or the entire assembly of materials is heated to a temperature above the eutectic point of the gold-germanium system, thereby causing eutectic reaction at the contacted surfaces and causing alloying. This method has the advantage that the unreacted part of gold wire, itself, can be conveniently used as an electrical lead wire. However, since alloying is carried out in a state wherein a relatively large gold source is present, precise control of the penetration depth is difficult. For this reason, pn junctions made by this method have not been used as emitter or collector junctions of junction-type transistors.

In the method of evaporation and alloying used for mesa-type transistors, aluminum is deposited by evaporation to desired planar dimensions at a thickness of one micron or less, and then alloyed to form a junction of shallow penetration depth. However, the alloying often takes place in the form of islands, and junction area and penetration depth vary in different samples. Such undesirable alloying results are caused primarily by insufficient quantities of aluminum.

It is a general object of the present invention to overcome the above-described difficulties associated with known techniques.

More specifically, it is an object of the invention to provide a method of fabrication whereby semiconductor devices having much improved characteristics can be produced with good reproducibility.

It is another object of this invention to provide a method which can be practiced in a relatively simple and economical manner without the use of complicated and expensive equipment.

The foregoing objects, as well as other specific objects and advantages as will presently become apparent, have been achieved by the present invention, which briefly described, provides a method of fabricating semiconductor devices in which alloying proceeds maintaining a state wherein a sheet of the alloying material is in intimate contact with a flat surface of the base material, thus obtaining an alloyed regrowth layer of controlled, uniform penetration depth without any overspreading of alloying. Particularly, the invention is related to a method of fabricating semiconductor devices by the alloying method in which a gold disk having a size within a limited range and containing an active impurity is alloyed to germanium at temperatures of a certain range.

A thin sheet of gold having a sufficiently flat and smooth surface and containing an active impurity is made to be in contact with a germanium pellet also having a sufficiently flat and smooth surface. The materials so assembled are heated to a temperature above the eutectic point of the gold-germanium system, 356° C. Eutectic reaction occurs over the entire contacted plane, and alloying takes place directly below the originally used thin sheet of gold, that is, alloying takes place only in a region of the same planar size and shape as the said sheet. In this case, the quantity of gold supplied is limited, and the germanium is amply supplied relative to the gold. Therefore, if the materials are maintained at a predetermined alloying temperature for a period sufficient to attain equilibrium conditions, the germanium will be dissolved to a depth expected from the gold-germanium phase diagram.

Then, the specimen is cooled slowly at a predetermined cooling rate, thus causing the germanium layer containing the active impurity added to the gold to be formed. For example, when a thin sheet of gold-gallium alloy is used for an n-type germanium, a p-type regrowth layer is produced and a pn junction formed.

The alloyed regrowth layer thus produced has a shape and size equal to the thin sheet of gold originally used and has a penetration depth of a certain constant value determined by the thickness of the thin sheet of gold and by the alloying temperature. Furthermore, the remarkable feature of the regrowth layer is the flatness of the bottom surface, and this fact makes it possible to improve the characteristics and to obtain good reproducibility of semiconductor devices. However, as a result of experiments carried out by the present inventors, it has been found that, in order to obtain such an ideal alloyed regrowth layer, there exists a certain desirable range for the size of the thin sheet of gold and/or for the alloying temperature. This discovery which is the essential substance of the present invention, will now be described more fully by the following disclosure.

First, regarding the alloying temperature, although it is obvious that this temperature must be higher than the eutectic point of gold-germanium system, it has been found that, in the temperature range between 356 degrees C. and 450 degrees C., the wetting between the thin gold sheet and the germanium is poor. Many instances were observed in which alloying does not take place. At all temperatures higher than 450 degrees C., good results are obtained, and pn junctions formed by the method of the present invention become good rectifiers. Since alloying is carried out satisfactorily at temperatures above 450 degrees C., it is possible to obtain a regrowth layer with a desired depth of penetration and thickness of the regrowth layer by varying the alloying temperature within the said range, in accordance with the characteristics required for the semiconductor device made by the method of this invention.

Next, as for the dimensions of the thin gold sheet, a certain, definite thickness must be determined, first of all to obtain a predetermined depth of penetration. On the other hand, as was mentioned hereinbefore in connection with the evaporation and alloying method for aluminum, if the thickness of a shin sheet is small as compared to its area, the curvature of the surface of the molten alloy will become excessively small, wherefore the molten alloy tends to increase its curvature by surface tension. As a result, dissolution of bare materials will proceed further in the region directly below the massive alloy mixture, whereas no alloying will take place in the parts deprived of molten alloy. That is, the molten alloy will tend to become bulky instead of retaining its original thin shape, whereby the area covered by the molten alloy will be reduced. As a result, alloying will proceed under the molten metal, whereas no alloying will occur in the part where the base material is not covered by molten alloy. Consequently, the shape of a regrowth layer obtained under the above described conditions differs from the shape of the initially-used thin sheet of gold, and regions are formed locally where alloying has not taken place and is surrounded by the region of normal alloying. In such a case, a semiconductor device having good characteristics cannot be obtained.

As a result of various experimental studies carried out by the present inventors, it has been found that, if a thin gold sheet is used in the shape of a disk, a regrowth layer having minimum deformation after alloying and optimum characteristics can be obtained by selecting the ratio of the diameter to the thickness to be within the range of from 2 to 30.

The shape of the above-mentioned thin gold sheet is not to be limited to a circular disk, it being possible to use a thin gold sheet of any arbitrary shape of circumference. In the case of such an arbitrary shape other than a circle, the line of the maximum length among the straight segment lines joining any two points on the closed curve constituting the circumference corresponds to the diameter of the aforesaid disk. That is, in the case of a thin sheet of gold of arbitrary shape, the same effect as that in the case of a circular disk can be obtained if the ratio of the above-mentioned straight line of maximum length to the thickness is within the range of 2 to 30.

Such a straight line, including the diameter of a circular disk, will hereinafter be referred to as the "effective diameter."

The afore-mentioned upper limit of 30 for the ratio of the effective diameter to the thickness does not mean that a good pn junction cannot be obtained at all by the method of this invention when this upper limit is exceeded; it merely means that, above this ratio of 30, the proportion of good pn junctions which can be obtained progressively decreases.

In order to prevent the localized "poor wetting" a method of alloying has been proposed where pressure is applied to the alloying materials. This method, however, has involved the complicated work of handling small jigs for pressure alloying, say 1-mm. in dimensions or even smaller. The present inventors have found that, by using a thin gold sheet of a suitable size, it is possible to alloy gold to result in good characteristics without the use of complicated jigs for pressure alloying. Accordingly, the present invention which, in one aspect, by its application, affords a significant convenience in the production of semiconductor devices.

Although, as described above, it is necessary that the ratio of the effective diameter to the thickness of the thin gold sheet be within a certain range in order to obtain a regrowth layer of good characteristics without poor wetting, the thickness itself should be in a certain limited range. The use of a thick gold sheet is disadvantageous from the standpoint of material cost and also in view of the resulting necessity of using a correspondingly thick germanium pellet. Moreover, from the standpoint of characteristics, also, the use of an extremely thick gold sheet is disadvantageous in that the gold and the germanium react to form a molten alloy whose surface, at the time of its liquid state, assumes the shape of a spherical surface of large curvature. As a result, since the supply of gold in the central part is plentiful, the germanium is melted to a great depth, and the bottom surface of the regrowth layer, after regrowth, becomes convex towards the germanium pellet. Accordingly, the leakage component of the reverse current is large in such a pn junction. It has been found experimentally that, in order to obtain a flat regrowth layer having good characteristics without the above-described disadvantages, it is necessary that the thickness of the gold sheet be less than 0.3 mm.

Figure 2:
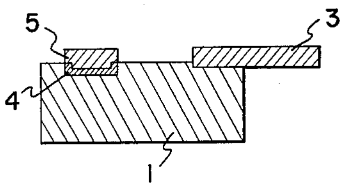
Figure 3:
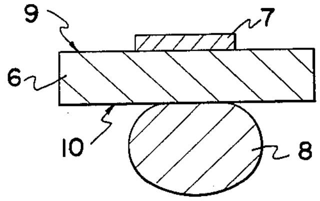
Figure 4:
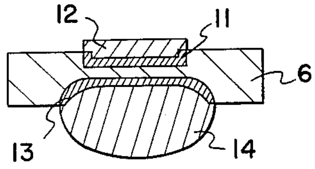

The nature and details of the present invention, which is based on the above-described findings, will be more fully apparent by reference to the following description of examples of preferred embodiments of the invention to be read in conjunction with the accompanying drawing in which like parts are designated by like reference numerals, and in which:

FIGURES 1 and 2 are enlarged elevational views, in vertical section, showing a diode in the process of fabrication by the method of the invention; and FIGURES 3 and 4 are similar views to be referred to in a later description of the process of fabricating a junction-type transistor according to the method of the invention and indicate the principle involved.

*Example 1*

Referring first to FIGURES 1 and 2, an n-type germanium pellet 1 having a resistivity of 2.3 ohm-cm., dimensions of 2 x 3 x 0.2 mm., and a smooth surface, were prepared by removing the worked surface layer by CP 4 etching. Next, a gold disk 2 having a diameter of 0.6 mm. and a thickness of 0.03 mm. and containing 2 percent of gallium, and a nickel sheet 3 with one end plated with tin were respectively placed on the germanium pellet 1 as indicated in FIGURE 1. The specimen so assembled was then maintained at 580 degrees C. for 10 minutes in a hydrogen gas stream, after which it was cooled at a rate of 7 degrees C. per minute, and a regrowth layer was formed.

Upon completion of the above-described process, the specimen possesses the physical features indicated in FIGURE 2. The layer designated by reference numeral 4 is a p-type germanium layer doped with gallium. The part above this p-type germanium layer 4 is gold-germanium eutectic part 5.

Thereafter, a nickel wire of 0.1 mm. in diameter was fused onto the gold-germanium eutectic layer 5 through the use of a small sphere of indium. The current-voltage characteristics of the element obtained by the above-described process were measured. The average value of the reverse current of several specimens was 3.1 microamperes at a reverse voltage of 12 volts and 4.2 microamperes at a reverse voltage of 30 volts, and the average value of the reverse breakdown voltage was 110 volts.

As will be apparent from the foregoing description, the method according to the present invention has the following principal advantages.

(1) The alloying proceeds while maintaining the state of intimate contact between the alloying material and semiconductor base wafer without the necessity of pressure being applied thereon.

(2) The depth of penetration is uniform.

(3) After the alloying process, no spreading of alloying materials is observed, and the area of the regrowth region does not appreciably depart from the area of the alloying material used.

(4) Since gold is used as a principal constituent, the alloying material is not readily subject to the effects of oxidation during the alloying process.

Particularly, in order to obtain the effectiveness of the method of this invention completely, it is preferable that the gold sheet, when used in the form of a disk, has a ratio of diameter to thickness in the range from 2 to 30 and a thickness less than 0.3 mm., and that the alloying temperature be selected to be higher than 450 degrees C.

Because the present invention possesses the above-stated advantages, it can be applied to all semiconductor devices in which pn junctions or ohmic contacts are formed by the alloying method to produce excellent results.

For example, a conventional alloyed junction type transistor is fabricated by alloying indium to the two faces of an n-type germanium base wafer to obtain emitter and collector. Instead of indium, however, the above-described thin gold sheet containing a predetermined quantity of an active impurity can be used according to the method of this invention to produce an excellent alloy junction type transistor.

*Example 2*

FIGURES 3 and 4 show an embodiment of the invention wherein a thin gold sheet was used for the emitter, and indium was used for the collector.

Referring first to FIGURE 3, a gold sheet 7 containing 3 percent of gallium and having a diameter of 0.6 mm. and a thickness of 30 microns was alloyed at 580 degrees C. on a surface 9 of an n-type germanium pellet 6 having a thickness of 130 microns and a resistivity of 3 ohm-cm. Thereafter, an indium dot 8 of 0.8 mm. diameter was alloyed at 500 degrees C. on the other surface 10 of the germanium pellet 6.

The structure of the semiconductor element obtained by the above-described process is indicated in FIGURE 4, where p-type germanium regrowth layers 11 and 13 were formed between the germanium element 6 and a gold-germanium eutectic part 7 and resolidified indium 14, respectively. The base width of these elements were 30 to 50 microns and transistors fabricated from these elements had a common-emitter current amplification factor $\alpha_{cb}$ of approximately 60.

While the foregoing description has been presented with respect to a junction-type transistor wherein a gold sheet is used for the emitter, and an indium dot is used for the collector, an excellent junction-type transistor can be produced also by using gold sheets for both the collector and the emitter.

It should be understood, of course, that the foregoing disclosure relates to only preferred embodiments of the invention and that it is intended to cover all changes and modifications of the examples of the invention herein chosen for the purposes of the disclosure, which do not depart from the spirit and scope of the invention as set forth in the appended claims.

What is claimed is:

1. A method of fabricating semiconductor devices which comprises placing a gold disk containing an active impurity and having a ratio of effective diameter to the thickness within the range of 2 to 30 in intimate surface contact with a germanium pellet, maintaining the specimen so assembled at a predetermined alloying temperature, and then causing regrowth to take place to form an alloyed regrowth layer.

2. A method of fabricating semiconductor devices which comprises alloying a gold disk containing active impurities and having a thickness of less than 0.3 mm. and a ratio of effective diameter to thickness of 2 to 30 to the surface of a germanium plate thus forming a regrowth layer having a flat bottom surface.

3. A method of fabricating semiconductor devices which comprises placing a gold disk containing active impurities and having a thickness of less than 0.3 mm. and a ratio of effective diameter to thickness of 2 to 30 in intimate surface contact with a germanium pellet, maintaining the specimen thus assembled at a temperature of 450° C. and above thus effecting alloying, and causing regrowth to occur to form an alloyed regrowth layer having a flat bottom surface.

4. A method of fabricating semiconductor devices which comprises placing a gold disk containing active impurities and having a thickness of less than 0.3 mm. and a ratio of effective diameter to thickness of 2–30 in intimate surface contact with a germanium pellet, maintaining the specimen thus assembled at a temperature of 450–580° C. thus effecting alloying and causing regrowth to occur to form an alloyed regrowth layer having a flat bottom surface.

5. A method of fabricating semiconductor devices which comprises placing a gold disk, containing gallium as active impurity, of a thickness of less than 0.3 mm. and having a ratio of effective diameter to thickness of 2 to 30 in intimate surface contact with a germanium pellet, maintaining the specimen thus assembled at a temperature of 450–580° C. thus effecting formation of an alloyed regrowth layer having a flat bottom surface.

6. In a method of fabricating semiconductor devices wherein gold containing active impurities is alloyed with a germanium pellet at a temperature above the eutectic point, the improvements which comprise applying said gold in the form of a disk of less than 0.3 mm. thickness and having a ratio of effective diameter to thickness of 2 to 30; thus causing an alloyed regrowth layer having a flat bottom surface to form.

7. In a method of fabricating semiconductor devices wherein gold containing active impurities is alloyed with a germanium pellet at a temperature above the eutectic point, the improvements which comprise applying said gold in the form of a disk of less than 0.3 mm. thickness and having a ratio of effective diameter to thickness of 2 to 30 at a temperature of 450° C. and above, thus causing an alloyed regrowth layer having a flat bottom surface to form.

8. In a method of fabricating semiconductor devices wherein gold containing active impurities is alloyed with a germanium pellet at a temperature above the eutectic point, the improvements which comprise applying said gold in the form of a disk of less than 0.3 mm. thickness and having a ratio of effective diameter to thickness of 2 to 30 at a temperature of 450–580° C.; thus causing an alloyed regrowth layer having a flat bottom surface to form.

9. In a method of fabricating semiconductor devices wherein gold containing active impurities is alloyed with a germanium pellet at a temperature above the eutectic point, the improvements which comprise said impurities consisting of gallium; said gold being applied in the form of a disk of less than 0.3 mm. thickness and having a ratio of effective diameter to thickness of 2 to 30 at a temperature of 450–580° C.; thus causing an alloyed regrowth layer having a flat bottom surface to form.

References Cited by the Examiner

UNITED STATES PATENTS

| | | | |
|---|---|---|---|
| 3,001,894 | 9/1961 | Becker et al. | 148—177 |
| 3,050,667 | 8/1962 | Emeis | 148—77 |

DAVID L. RECK, *Primary Examiner.*

R. O. DEAN, *Assistant Examiner.*